(12) United States Patent
Chen et al.

(10) Patent No.: US 12,408,428 B2
(45) Date of Patent: Sep. 2, 2025

(54) INTEGRATED CIRCUIT, METHOD FOR FORMING A LAYOUT OF INTEGRATED CIRCUIT USING STANDARD CELLS

(71) Applicant: UNITED MICROELECTRONICS CORP., Hsin-Chu (TW)

(72) Inventors: Chien-Hung Chen, Taipei (TW); Ruei-Yau Chen, Pingtung County (TW); Wei-Jen Wang, Tainan (TW); Kun-Yuan Wu, Kaohsiung (TW); Chien-Fu Chen, Miaoli County (TW); Chen-Hsien Hsu, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 606 days.

(21) Appl. No.: 17/869,797

(22) Filed: Jul. 21, 2022

(65) Prior Publication Data

US 2023/0099326 A1 Mar. 30, 2023

Related U.S. Application Data

(63) Continuation-in-part of application No. 17/517,642, filed on Nov. 2, 2021.

(30) Foreign Application Priority Data

Sep. 28, 2021 (TW) .................................. 110135987

(51) Int. Cl.
*H10D 84/90* (2025.01)
*G06F 30/392* (2020.01)

(52) U.S. Cl.
CPC ......... *H10D 84/907* (2025.01); *G06F 30/392* (2020.01); *H10D 84/981* (2025.01)

(58) Field of Classification Search
CPC ... H10D 84/907; H10D 84/981; G06F 30/392
See application file for complete search history.

(56) References Cited

U.S. PATENT DOCUMENTS

| | | | |
|---|---|---|---|
| 7,302,660 B2 | 11/2007 | Shimamura | |
| 7,943,966 B2 | 5/2011 | Becker | |
| 8,698,205 B2 | 4/2014 | Tzeng | |
| 10,990,740 B2 | 4/2021 | Kim | |
| 2005/0280031 A1 | 12/2005 | Yano | |
| 2011/0133253 A1 | 6/2011 | Nakanishi | |
| 2018/0004882 A1 | 1/2018 | Hsieh | |
| 2019/0123063 A1 | 4/2019 | Hino | |

(Continued)

FOREIGN PATENT DOCUMENTS

| | | |
|---|---|---|
| JP | 2011-134838 A | 7/2011 |
| KR | 10-2020-0018134 A | 2/2020 |

(Continued)

*Primary Examiner* — Timor Karimy
(74) *Attorney, Agent, or Firm* — Winston Hsu

(57) ABSTRACT

A method for forming an integrated circuit layout including at least two standard cells having different cell heights is disclosed. The standard cells respectively have a well boundary to divide a PMOS region and an NMOS region. The standard cells are abutted side by side along their side edges in a way that the well boundaries of the cells are aligned along the row direction. The power rail and the ground rail of one of the standard cells are extended in width or length to connect to the power rail and the ground rail of the other one of the standard cells.

10 Claims, 11 Drawing Sheets

(56) References Cited

U.S. PATENT DOCUMENTS

| 2020/0328201 | A1 | 10/2020 | Li |
| 2020/0411063 | A1 | 12/2020 | Fujiwara |
| 2024/0014203 | A1 | 1/2024 | Li |

FOREIGN PATENT DOCUMENTS

| KR | 10-2020-0121739 A | 10/2020 |
| TW | 202129529 A | 8/2021 |
| TW | 202131216 A | 8/2021 |
| TW | 202131218 A | 8/2021 |
| TW | 202133020 A | 9/2021 |
| WO | 2012/023247 A1 | 2/2012 |

INTEGRATED CIRCUIT, METHOD FOR FORMING A LAYOUT OF INTEGRATED CIRCUIT USING STANDARD CELLS

CROSS REFERENCE TO RELATED APPLICATIONS

This application is a continuation-in-part of U.S. application Ser. No. 17/517,642, filed on Nov. 2, 2021. The content of the application is incorporated herein by reference.

BACKGROUND OF THE INVENTION

1. Field of the Invention

The present invention relates to the field of integrated circuits. More particularly, the present invention relates to a method for forming an integrated circuit layout using standard cells and an integrated circuit layout obtained therefrom.

2. Description of the Prior Art

As the needs for better performance and various applications are increased, the integrated circuits (ICs) has become more and more complicated and usually includes hundreds of thousands or millions of logic gates. In the industry, to facilitate circuit design process, circuit units of specific logic functions commonly used in an integrated circuit are usually designed into standard cells with logic gates, such as NAND cells, NOR cells, d-flip-flop cells, latch cells, I/O cells, OP amplifier cells, ADC cells, DAC cells. After verifying the manufacturability for mass production of the standard cells, standard cell libraries including the verified standard cells may be authorized to the chip designers to construct functional circuitries by electronic design automation (EDA) tools such as logic simulators, logic synthesizers, and automatic placement/routing tools. A typical circuit design process usually involves specifying the functionality of the circuit using a hardware programming language, synthesizing/mapping the resulting circuit description into basic logic gates of standard cell libraries, placing and routing physical layouts based on the gate netlist, and finally verifying proper connectivity and functionality of the layout. In this way, a complex and large integrated circuit layout may be correctly constructed automatically within a short period of time.

A standard cell library associated with a specific logic function may include hundreds of standard cells that can be selectively combined to design a larger circuit. A standard cell is usually laid out relative to a grid defined by horizontal and vertical tracks. The number of horizontal tracks defines the height of the cell (also referred to as cell height or track height). The number of vertical tracks defines the width of the cell (also referred to as cell width or track width). Conventional standard cell libraries are comprised of cells having the same height to enable cells of the cell library to be readily combined to create larger circuits. The widths of standard cells in the library may vary.

In advanced technology, in order to optimize area efficiency, speed and power consumption of the synthesized integrated circuit, a cell library may be provided with standard cells having devices laid out in different dimensions and therefore having different cell heights. However, intermixing of the standard cells having different cell heights in a same routing block are constrained by reduced efficiency of the synthesis tool due to pattern irregularity. Besides, manufacturing process window may also be impacted. To resolve the above problems, a common approach taken currently is to put the standard cells with different cell heights into different monolithic routing blocks and electrically connect the standard cells by metal interconnections. However, this has adversely limited the design flexibility. The extended length of the metal interconnections may also increase the power consumption during operation of the integrated circuit.

What is therefore needed in the field is a method able to effectively produce an integrated circuit layout including intermixing of standard cells having different cell heights, and an integrated circuit layout obtained therefrom.

SUMMARY OF THE INVENTION

The present invention is directed to provide a method for forming an integrated circuit layout including mixed-height standard cells retrieved from a same standard cell library or from different cell libraries, and an integrated circuit layout obtained therefrom. The present invention is able improve design flexibility, synthesis efficiency, and inline process manufacturability.

One embodiment of the present invention provides a method for forming an integrated circuit layout including the following steps. First a first standard cell and a second standard cell of a same function and having different cell heights are selected. The first standard cell and the second standard respectively include a power rail, a ground rail, and a well boundary extending in parallel along a first direction. Two active regions of opposite conductivity types are arranged between the power rail and the ground rail and at two sides of the well boundary. A gate line extends along a second direction and intersects the two active regions. The first direction and the second direction are perpendicular. Following, the first standard cell and the second standard cell are abutted side by side to form a temporary placement in a way that the well boundaries of the first standard cell and the second standard cell are aligned along the first direction. After that, based on the temporary placement, the integrated circuit layout is generated by extending widths of the power rail and the ground rail of the second standard cell along the second direction until flush with edges of the power rail and the ground rail of the first standard cell along the first direction, and/or extending lengths of the power rail and the ground rail of the first standard cell along the first direction until flush with edges of the power rail and the ground rail of the second standard cell along the second direction.

Another embodiment of the present invention provides an integrated circuit layout, which includes a power rail and a ground rail extending in parallel along a first direction and respectively having a narrow portion connected to a wide portion. A first standard cell is arranged between the narrow portions of the power rail and the ground rail. A second standard cell is arranged between the wide portions of the power rail and the ground rail and abutted to a side of the first standard cell. The first standard cell and the second standard cell are of a same function and respectively includes an upper edge overlapping the power rail, a lower edge overlapping the ground rail, a well boundary between the upper edge and the lower edge, two active regions of opposite conductivity types at two sides of the well boundary, and a gate line extending between the upper edge and the lower edge along a second and intersecting the two active regions, wherein the first direction and the second direction are perpendicular. A first cell height between the upper edge and lower edge of the first standard cell and a second cell height between the upper edge and lower edge of the second standard cell are different, and the well boundaries of the first standard cell and the second standard cell are aligned along the first direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size and are not necessarily drawn to scale, for the sake of clarity and convenience in the drawings. The same reference signs are generally used to refer to corresponding or similar features in modified and different embodiments.

DETAILED DESCRIPTION

Figure 1:
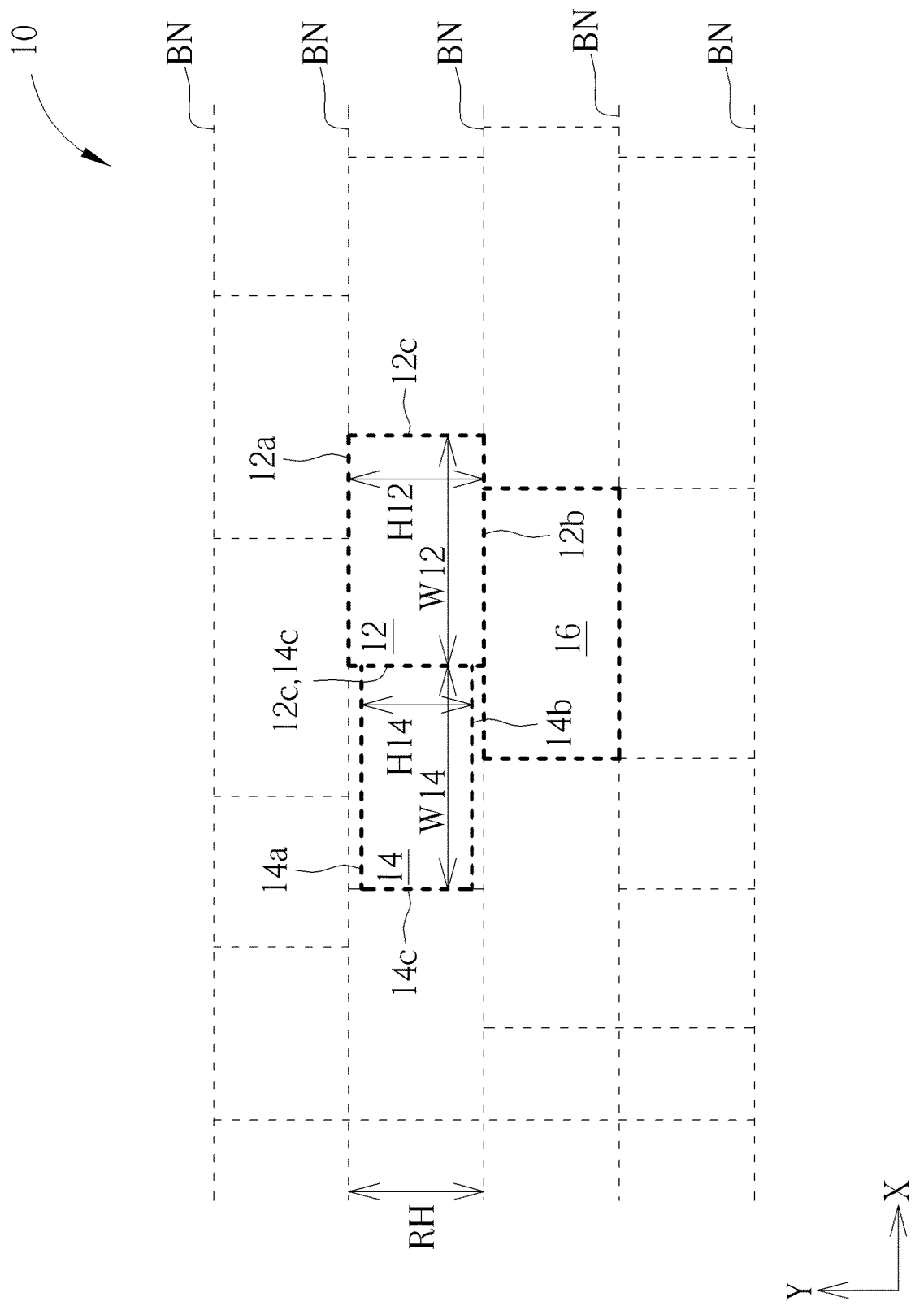
FIG. 1 is a schematic plan view illustrating how standard cells are placed within rows of an integrated circuit layout according to an embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

For the convenience of illustrating the spatial relationships of the features, the first direction X and the second direction Y which are perpendicular to each other are shown in the drawing. In addition to the orientation shown in the drawings, other orientations (for example, rotated by 90 degrees or other directions) of the present invention may also be explained by the spatially relative descriptions in the specification. The term "cell width" or "track width" refer to a width of a standard cell taken along the first direction X and between two side edges of an abutment box (or abutment area) of the cell. The term "cell height" refer to a height of a standard cell taken along the second direction Y and between an upper edge and a lower edge of the abutment box, and may be referred to as "track height". The width of a power rail or a ground rail refers to a width taken along the second direction Y, and may be referred to as "track width". The cell height and the cell width may be described as a predetermined number of tracks, such as 7T, 8T or 9T.

It should be understood that the number of the gate line of the standard cells in the embodiments of the present invention are only examples, and may be modified in other embodiments without departing from the scope of the present invention. The number of the gate line of the present invention may be single or plural.

FIG. 1 is a schematic plan view of a portion of an integrated circuit layout 10, illustrating how standard cells having different cell heights are placed within a row according to an embodiment of the present invention. Four rows are exemplarily shown in FIG. 1. The rows respectively run along the first direction X and are butted to each other along the row boundaries BN. The first direction X is also referred to as the row direction. The rows have a fixed row height RH, which means that the row boundaries BN of the integrated circuit layout 10 are equally spaced. Standard cells are placed within the rows and tied to voltage rails (such as power rails and ground rails) that run continuously through the integrated circuit layout 10 along the row boundaries BN. It is noteworthy that the constituent standard cells of the integrated circuit layout 10 may have different cell heights, and the row height RH is equal to the maximum cell height of the standard cells to be placed within the rows.

For example, as shown in FIG. 1, the integrated circuit layout 10 may include standard cells 12 and 14 abutted side by side within a row. The standard cells 12 and 14 may be selected from different cell libraries or a mixed-height cell library associated with a specific logic function. The standard cell 12 includes a abutment box, which includes an upper edge 12a, a lower edge 12b, and the two side edges 12c, wherein a cell height H12 of the first standard cell 12 is defined by the distance between the upper edge 12a and the lower edge 12b, and a cell width W12 of the first standard cell 12 is defined by the distance between the two side edges 12c. The standard cell 14 includes a abutment box, which includes an upper edge 14a, a lower edge 14b, and the two side edges 14c, wherein a cell height H14 of the standard cell 14 is defined by the distance between the upper edge 12a and the lower edge 12b, and a cell width W14 of the standard cell 14 is defined by the distance between the two side edges 14c. The standard cells 12 and 14 are abutted by overlapping the side edges 12c and 14c to reduce useless areas between them. The standard cells 12 and 14 have a same logic function (such as AND gates, NAND gates, inverters, OR gates, NOR gates, or flip flops, but is not limited thereto) but different cell heights for the purpose of laying out functional components in different dimensions for different electrical performances. According to an embodiment of the present invention, the cell height H12 of the standard cell 12 may be larger than the cell height H14 of the standard cell 14, and equal to the row height RH. Therefore, the upper edge 12a and the lower edge 12b of the standard cell 12 are overlapped with the row boundaries BN, while the upper edges 14a and the lower edge 14b of the standard cell 14 are spaced from the row boundaries BN by the same or different distances. Functional components of the standard cells 12 and 14 laid within the abutment boxes are tied to a same power rail and/or a same ground rail running along the row boundaries BN at the top and bottom of the row.

Another standard cell 16 may be placed in a row adjacent to the row of the standard cells 12 and 14. The standard cell 16 may be selected from another cell library, the same cell library of the standard cells 12 or 14, or the mixed-height cell library of the standard cells 12 and 14. The standard cell 16 may have an abutment box and a cell height and a cell width. When the cell height of the standard cell 16 is equal to the row height RH, the upper edge and the lower edge of the abutment box of the standard cell 16 may overlap the row boundaries BN, and the abutment box of the standard cell 16 is abutted to the lower edge 12b of the abutment box of the standard cell 12. When the cell height of the standard cell 16 is smaller than the row height RH (similar to the standard cell 14), the upper edge and the lower edge of the abutment box of the standard cell 16 would be spaced from the row boundaries BN by the same or different distances. In this case, the abutment boxes of the standard cells 12 and 16 would be separated. According to an embodiment of the present invention, the functional components of the standard cells 12 and 16 are tied to a same power rail (or a same ground rail, depending on the orientation of the cells) along the row boundary BN between them. In this way, space efficiency of the integrated circuit layout 10 may be improved.

Figure 2:
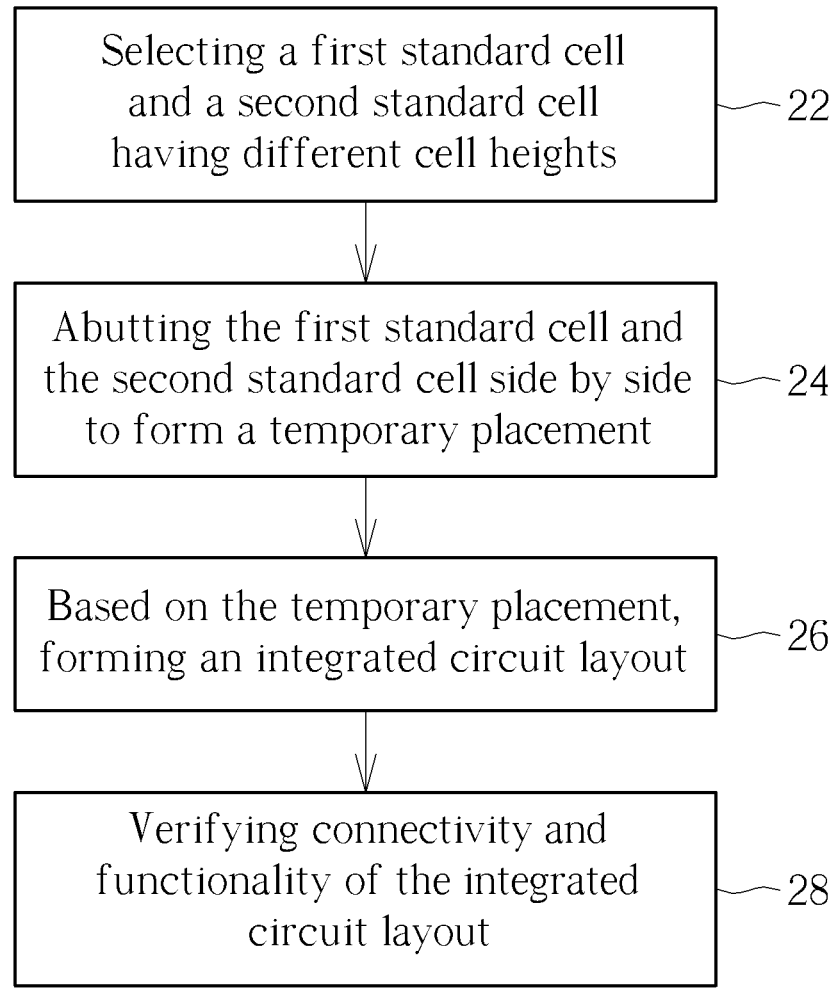
FIG. 2 is a flow chart illustrating a method for forming an integrated circuit layout according to an embodiment of the present invention.
Figure 3:
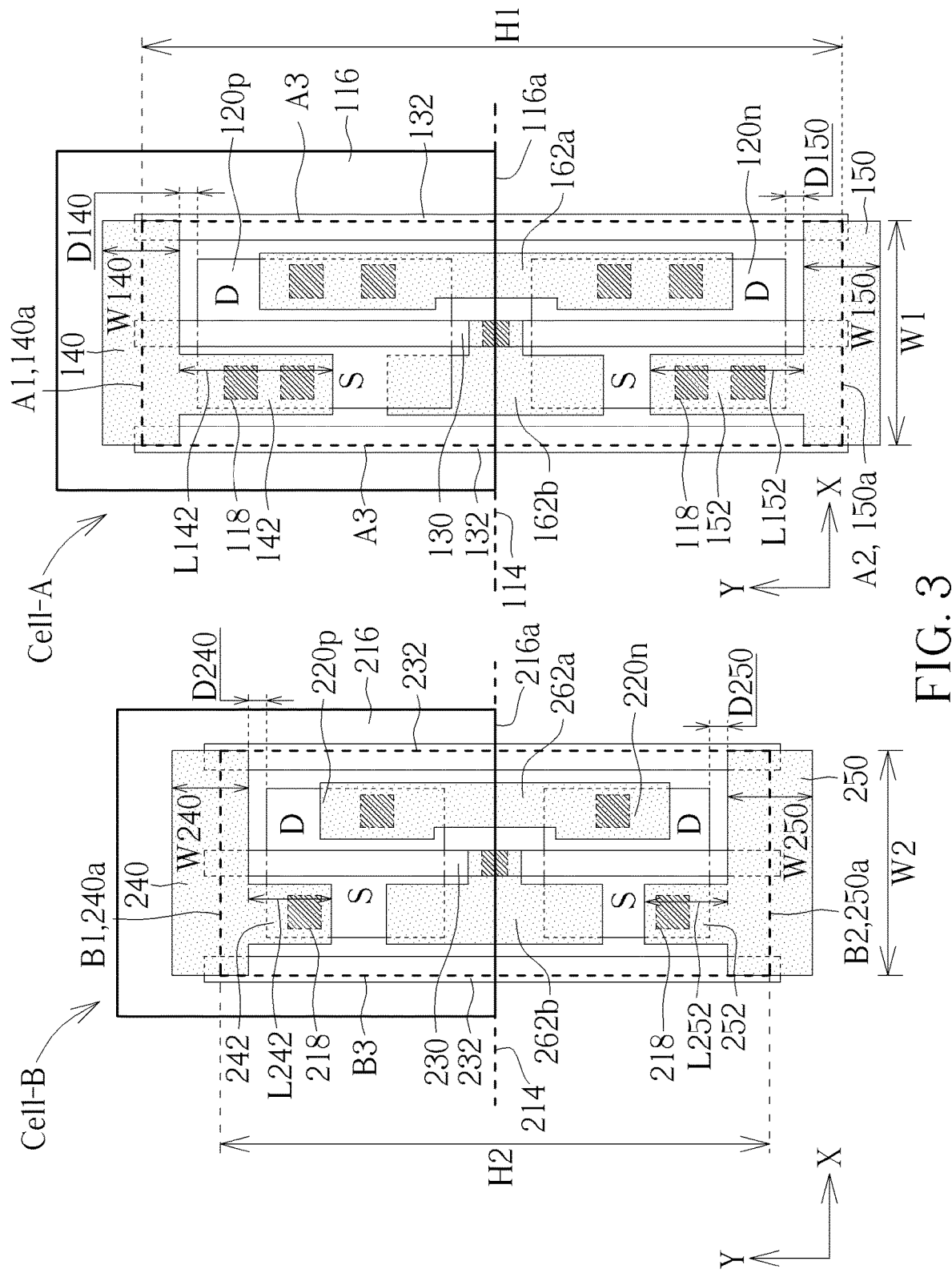
FIG. 3 to FIG. 5 are plan views illustrating the steps of the flow chart shown in FIG. 2.
Figure 4:
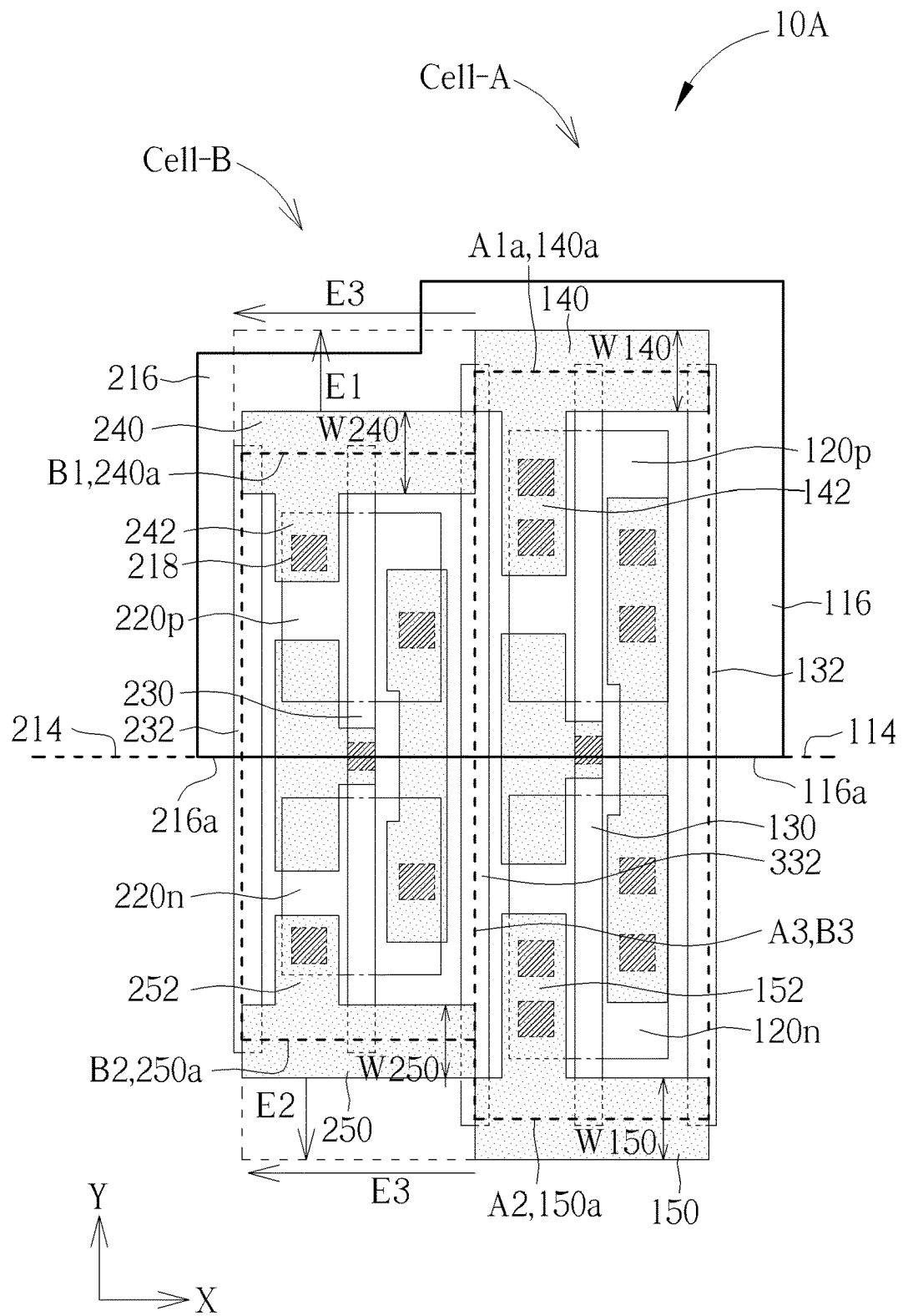
Figure 5:
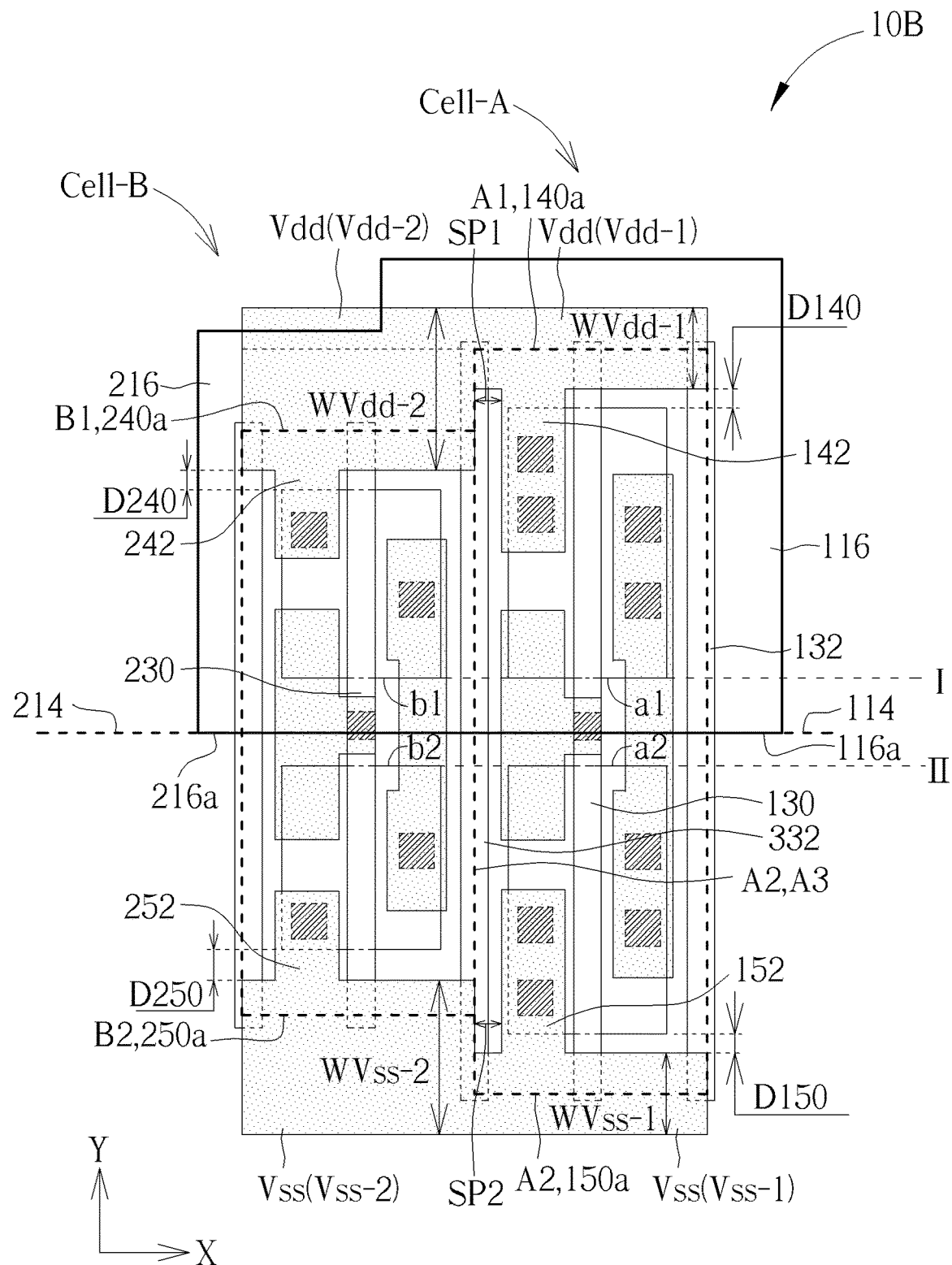
Figure 10:
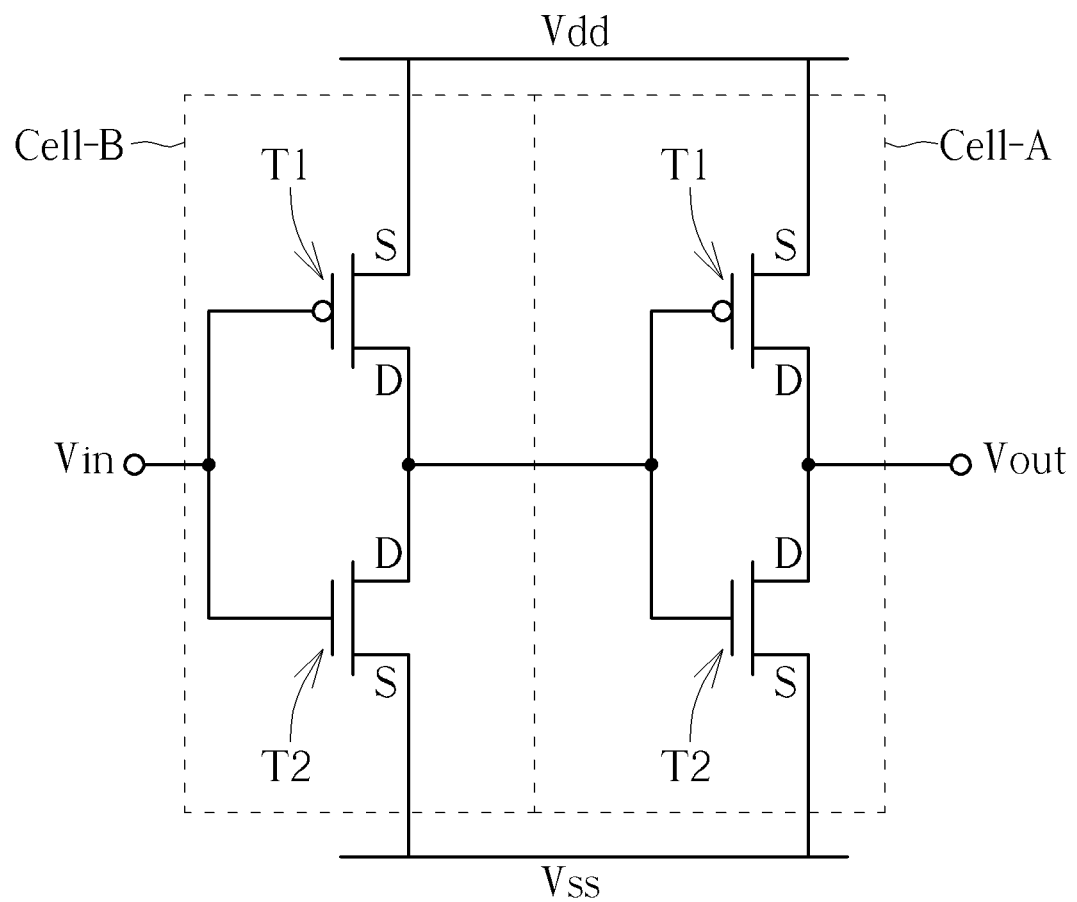
FIG. 10 is a circuit diagram of the integrated circuit shown in FIG. 5.

Please refer to FIG. 2 to FIG. 5, and FIG. 10. FIG. 2 is a flow chart illustrating a method for forming an integrated circuit layout using standard cells having different cell heights according to an embodiment of the present invention. FIG. 3 to FIG. 5 are plan views showing how to abut an exemplary first standard cell Cell-A and an exemplary second standard cell Cell-B having different cell heights to form an integrated circuit layout through the method shown in FIG. 2. FIG. 10 is a circuit diagram of the integrated circuit shown in FIG. 5. The method shown in FIG. 2 may be carried out in an electronic design automation (EDA) environment.

At step 22, a first standard cell and a second standard cell are selected based on a get netlist of an integrated circuit. The first standard cell and second standard cell have the same logic function but have different cell heights and different electrical performances. For example, as shown in FIG. 3, the first standard cell Cell-A and the second standard cell Cell-B may be inverters. In detail, the first standard cell Cell-A includes an abutment box (the box delineated with bold dashed line) having an upper edge A1 and a lower edge A2 extending in parallel along the first direction X, and two side edges A3 extending in parallel along the second direction Y. The first standard cell Cell-A has a cell height H1 defined by the upper edge A1 and the lower edge A2, and a cell width W1 defined by the two side edges A3. A centerline 114 runs through the center of the abutment box along the first direction X, and divides the abutment box into two equal parts. In other words, the distances from the centerline 114 to the upper edge A1 and the lower edge A2 are the same. Two active regions 120p and 120n of opposite conductivity types are respectively arranged in the two parts of the abutment box. A gate line 130 extends along the second direction Y and intersects the two active regions 120p and 120n. Two dummy gate lines 132 parallel to the gate line 130 are arranged along the two side edges A3 at two sides of the two active regions 120p and 120n. According to an embodiment of the present invention, the gate line 130 and the dummy gate lines 132 have a same length along the second direction Y, and line ends of the gate line 130 and the dummy gate lines 132 are flush with each other along the first direction X. A well region 116 completely overlaps the upper part of the abutment box and the active region 120p. As shown in FIG. 3, the well boundary 116a of the well region 116 may be overlapped with the centerline 114 of the abutment box. According to an embodiment of the present invention, the active region 120p is p-type, and the active region 120n is n-type. The intersecting area of the gate line 130 and the active region 120p forms a p-type metal oxide semiconductor transistor (PMOS). The intersecting area of the gate line 130 and the active region 120n forms an n-type metal oxide semiconductor transistor (NMOS). The portions of the active regions 120p and 120n at the left side (the side near the conductive connectors 142 and 152) of the gate line 130 are source regions S of the PMOS and the NMOS. The portions of the active regions 120p and 120n at the right side of the gate line 130 are drain regions D of the PMOS and the NMOS. The well region 116 defines an n-well where the p-type active region 120p is to be formed in a p-type substrate during fabrication of the integrated circuit.

The first standard cell Cell-A further includes a power rail 140 and a ground rail 150 respectively arranged on the upper edge A1 and the lower edge A2 along the second direction Y. The width W140 of the power rail 140 and the width W150 of the ground rail 150 may be the same or different. According to an embodiment of the present invention, the centerline 140a of the power rail 140 that divides the power rail 140 into two equal parts may be completely overlapped with the upper edge A1. The centerline 150a of the ground rail 150 that divides the ground rail 150 into two equal parts may be completely overlapped with the lower edge A2. The power rail 140 lies beyond an edge of the active region 120p by a distance D140. The ground rail 150 lies beyond an edge of the active region 120n by a distance D150. The distance D140 and the distance D150 may be the same or different according to design needs.

The first standard cell Cell-A further includes conductive connectors and contact plugs to interconnect the transistors and the power rail and the ground rail to enable the functionality of the first standard cell Cell-A. In detail, conductive connectors 142 and 152 are arranged at a same side of the gate line 130, respectively connect to the power rail 140 and the ground rail 150 and partially overlap the source regions S of the active regions 120p and 120n. The conductive connector 142 has a length L142. The conductive connector 152 has a length L152. The length L142 and the length L152 may be the same or different according to design needs. A conductive connector 162a is arranged at the other side of the gate line 130 and partially overlaps the drain regions D of the active regions 120p and 120n. A conductive connector 162b is arranged at the same side as the conductive connectors 142 and 152 and has a protrusion partially overlapping the middle portion of the gate line 130. A plurality of contacts plugs 118 are provided to electrically connect the source region S of the active region 120p to the conductive connector 142 and the power rail 140, the source region S of the active region 120n to the conductive connector 152 and the ground rail 150, the gate line 130 to the conductive connector 162b, and the drain regions D of the active regions 120p and 120n to the conductive connector 162a. According to an embodiment of the present invention, the power rail 140, the ground rail 150, and the conductive connectors 142, 152, 162a, 162b are laid on a same layout layer, such as metal-1 layer. According to some embodiments of the present invention, the first standard cell Cell-A is a high performance cell.

Same as the first standard cell Cell-A, the second standard cell Cell-B includes an abutment box (the box delineated with bold dashed line) having an upper edge B1, a lower edge B2, two side edges A3, a cell height H2, and a cell width W2. A centerline 214 runs through the center of the abutment box of the second standard cell Cell-B. A p-type active region 220p and an n-type active region 220n are arranged at two sides of the centerline 214. A gate line 230 intersects the active regions 220p and 220n, forming a PMOS and an NMOS, respectively. Two dummy gate lines 232 are at two sides of the two active regions 120p and 120n. The gate line 230 and the dummy gate lines 232 may have a same length along the second direction Y. Line ends of the gate line 230 and the dummy gate lines 232 may be flush with each other along the first direction. A well region 216 completely overlaps the upper part of the abutment box of the second standard cell Cell-B, and may have a well boundary 216a overlapped with the centerline 214. A power rail 240 and a ground rail 250 respectively arranged on the upper edge B1 and the lower edge B2. The power rail 240 lies beyond an edge of the active region 220p by a distance D240. The ground rail 250 lies beyond an edge of the active region 220n by a distance D250. The distance D240 and the distance D250 may be the same or different according to design needs. According to an embodiment of the present, the distance D140 and the distance D240 may be the same. The distance D150 and the distance D250 may be the same. The centerline 240a of the power rail 240 that divides the power rail 240 into two equal parts may be completely overlapped with the upper edge B1. The centerline 250a of the ground rail 250 that divides the ground rail 250 into two equal parts may be completely overlapped with the lower edge B2. The width W240 of the power rail 240 and the width W250 of the ground rail 250 may be the same or different. According to an embodiment of the present invention, the width W240 of the power rail 240 of the second standard cell Cell-B may be the same as the width W140 of the power rail 140 of the first standard cell Cell-A. The width W250 of the ground rail 250 of the second standard cell Cell-B may be the same as the width W150 of the ground rail 150 of the first standard cell Cell-A. Conductive connectors 242, 252, 262a, 262b and contact plugs 218 are provided to interconnect the transistors and the power rail 240 and the ground rail 250 to enable the functionality of the first standard cell Cell-B. The conductive connector 242 has a length L242. The conductive connector 252 has a length L252. The length L242 and the length L252 may be the same or different according to design needs. Other detailed descriptions of the components of the second standard cell Cell-B may be referred to previous descriptions of the first standard cell Cell-A, and are not explained herein for the sake of brevity. According to some embodiments of the present invention, the second standard cell Cell-B is a low power cell having better area efficiency and lower power leakage. Along the second direction Y, a width of the active region 220p, a width of the active region 220n, and a length of the gate line 230 of the second standard cell Cell-B are respectively smaller than a width of the active region 220p, a width of the active region 220n, and a length of the gate line 130 of the first standard cell Cell-A. Depending on the width of the active regions, the length L242 and the length L252 of the conductive connectors 242 and 252 may be smaller than the length L142 and the length L152 of the conductive connectors 142 and 152. The cell height H2 of the second standard cell Cell-B is smaller than the cell height H1 of the first standard cell Cell-A.

Subsequently, at step 24, the first standard cell and the second standard cell are abutted side by side to form a temporary placement 10A. As shown in FIG. 4, the first standard cell Cell-A and the second standard cell Cell-B are abutted in a way that the side edges A3, B3 of the first standard cell Cell-A and the second standard cell Cell-B are overlapped, and the well boundary 116a of the first standard cell Cell-A and the well boundary 216a of the second standard cell Cell-B are aligned along the first direction X. According to an embodiment of the present invention, the dummy gate line 132 and the dummy gate line 232 on the overlapped side edges A3, B3 are overlapped and combined to form a shared dummy gate line 332. According to an embodiment of the present invention, the dummy gate line 332 is spaced from the gate line 130 and the gate line 230 by a same pitch. According to an embodiment of the present invention the dummy gate line 332 may have a same length as the gate line 130 along the second direction Y. Line ends of the dummy gate line 332 and the gate line 130 are flush with each other along the first direction X.

Subsequently, at step 26, an integrated circuit layout is formed based on the temporary placement. As shown in FIG. 4 and FIG. 5, after abutting the first standard cell Cell-A and the second standard cell Cell-B, the power rail 240 and the ground rail 250 of the second standard cell Cell-B are recognized and extended along the second direction Y respectively by an extending width E1 and an extending width E2 (shown in FIG. 4) until the outer edge of the power rail 240 is aligned with the outer edge of the power rail 140 and the outer edge of the ground rail 250 are aligned with the outer edge of the ground rail 150. In some cases, the power rail 140 and the ground rail 150 of the first standard cell Cell-A are recognized and extended along the first direction X by an extending length E3 (shown in FIG. 4) until the side edges of the power rail 140 and ground rail 150 are aligned with the side edges of the power rail 240 and ground rail 250. By performing at least one of the above actions, the power rail 240 and ground rail250' of the second standard cell Cell-B are respectively connect to the power rail 140 and ground rail 150 of the first standard cell Cell-A, such that an integrated circuit layout 10B including a continuous power rail Vdd and a continuous ground rail Vss are obtained. As shown in FIG. 5, the power rail Vdd includes a narrow portion Vdd-1 having a width WVdd-1 and a wide portion Vdd-2 having a width WVdd-2 connected to the narrow portion Vdd-1. The width WVdd-1 is the same as the width W140 of the power rail 140 of the first standard cell Cell-A. The WVdd-2 is a larger than the width W240 of the power rail 240 of the second standard cell Cell-B. Similarly, the ground rail Vss includes a narrow portion Vss-1 having a width WVss-1 and a wide portion Vss-2 having a width WVss-2 connected to the narrow portion Vss-1. The width WVss-1 is the same as the width W150 of the ground rail 150 of the first standard cell Cell-A. The WVss-2 is a larger than the width W250 of the ground rail 250 of the second standard cell Cell-B. The conductive connectors 142, 152, 242, 252 may remain in their original positions and keep their original lengths. As shown in FIG. 5, a space SP1 may present between the wide portion Vdd-2 of the power rail Vdd and the conductive connector 142. Another space SP2 may present between the wide portion Vss-2 of the ground rail Vss and the conductive connector 145. The space SP1 and the space SP2 are larger than a minimum spacing rule for laying the layer (such as minimum metal-1 spacing rule).

Subsequently, at step 28, the connectivity and functionality of the integrated circuit layout 10B are verified. After that, the integrated circuit layout 10B is output to a set of photomasks used in a manufacturing process to form an integrated circuit chip.

Please refer to FIG. 10, which is a circuit diagram corresponding to the integrated circuit layout 10B as shown in FIG. 5. Cell-A and Cell-B electrically coupled in a cascade manner, and respectively include a PMOS T1 and an NMOS T2. In each cell, the gates of the PMOS T1 and the NMOS T2 are connected to each other and form an input terminal of the cell which is electrically coupled to an input voltage Vin. The drain regions D of the PMOS T1 and the NMOS T2 are coupled with each other and form an output terminal of the cell which is coupled to an output voltage Vout. The source region S of the PMOS T1 is coupled to the power rail Vdd, and the source region S of the NMOS T2 is coupled to the ground rail Vss. The output terminal of Cell-B is the input terminal of Cell-A. The power rail Vdd is coupled to a high voltage or an operation voltage. The ground rail Vss is coupled to a low voltage, a reference voltage, or a ground voltage.

It is noteworthy that in the embodiment shown in FIG. 3 to FIG. 5, the extending widths E1 and E2 are the same since the centerlines 114 and 214 of the first standard cell Cell-A and the second standard cell Cell-B are aligned. In some embodiments, edges a1 and b1 of the active regions 120$p$ and 220$p$ of the same conductivity type (such as p-type) adjacent and parallel to the well boundaries 116$a$ and 216$a$ may be aligned along the first direction X (for example, along the line I'). In some embodiments, edges a2 and b2 of the active regions 120$n$ and 220$n$ of the same conductivity type (such as n-type) adjacent and parallel to the well boundaries 116$a$ and 216$a$ may be aligned along the first direction X (for example, along the line II).

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
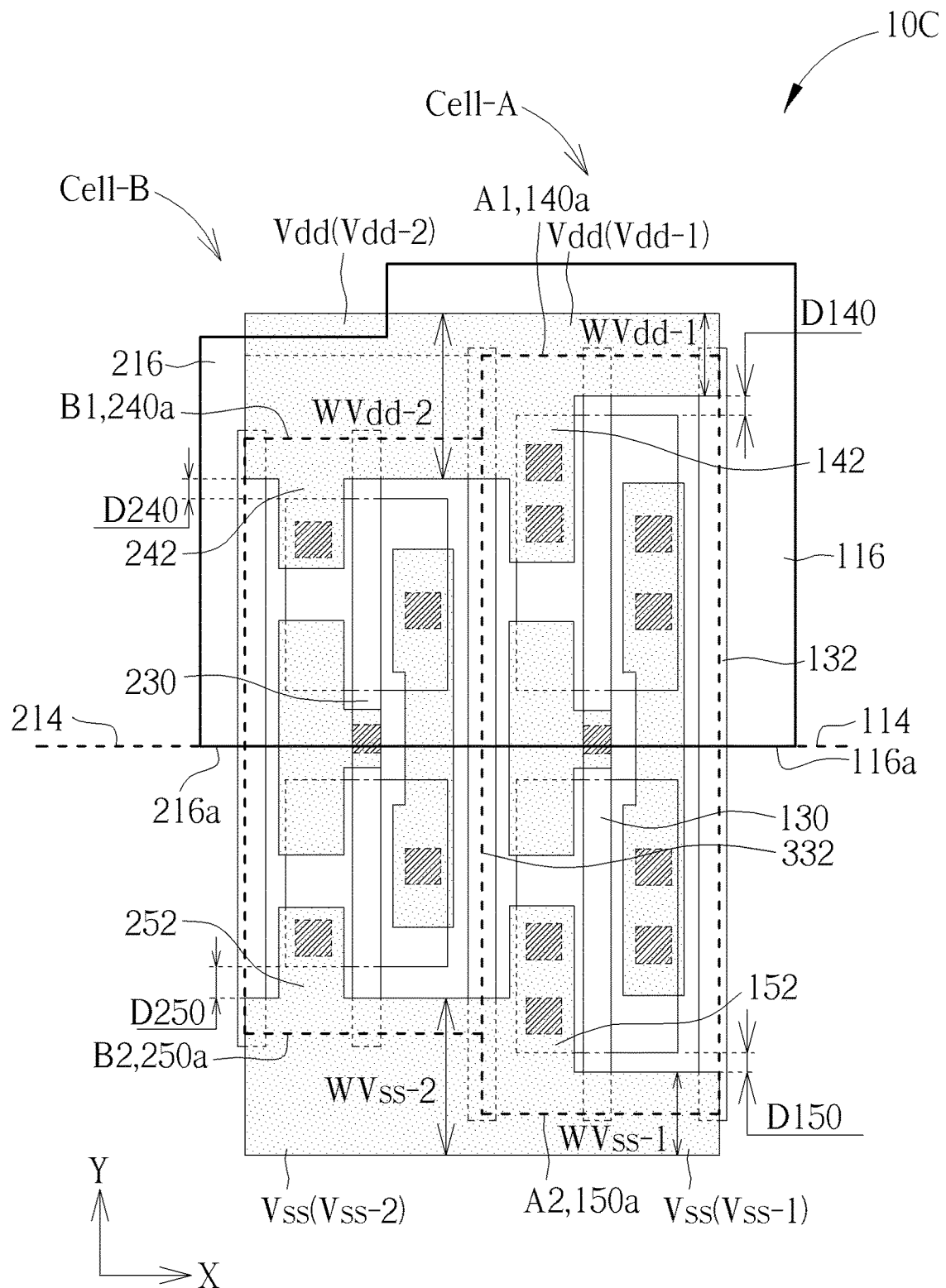
FIG. 6 is a schematic plan view of an integrated circuit layout according to an embodiment of the present invention.

Please refer to FIG. 6, which is a schematic plan view of an integrated circuit layout 10C according to an embodiment of the present invention. The integrated circuit layout 10C shown in FIG. 6 is substantially the same as the integrated circuit layout 10B shown in FIG. 5 except that, when the spaces SP1 and SP2 are smaller than the minimum spacing rule, the sides of the power rail 240 and the ground rail 250 of the second standard cell Cell-B may extend along the second direction to fill the spaces SP1 and SP2, such that violations during rule check may be avoided.

Figure 7:
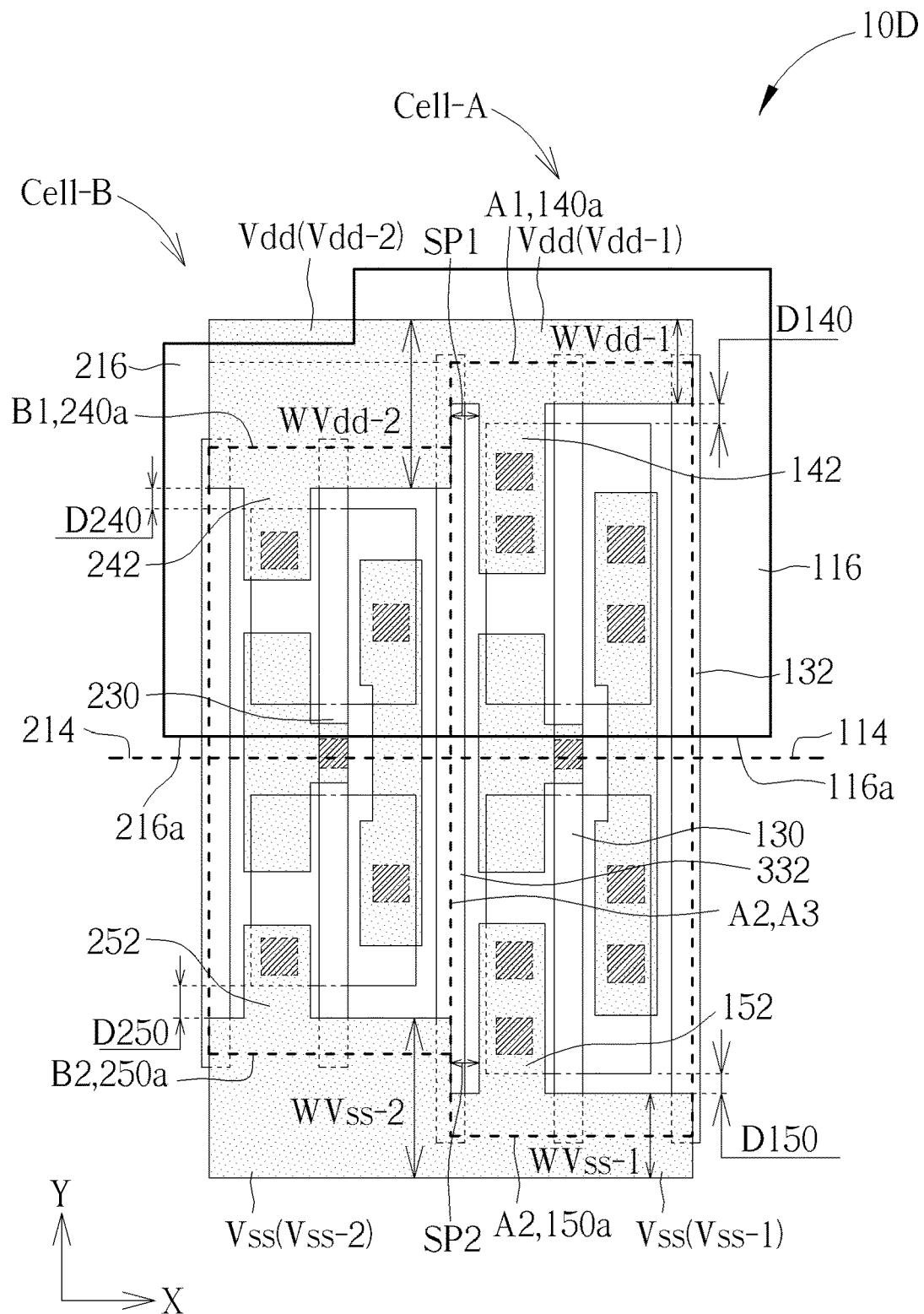
FIG. 7 is a schematic plan view of an integrated circuit layout according to an embodiment of the present invention.

Please refer to FIG. 7, which is a schematic plan view of an integrated circuit layout 10D according to an embodiment of the present invention. In some cases, the n-type active region and the p-type active region of the standard cell may have different well enclosure/space rules. The well boundary may not overlap the centerline of the standard cell. For example, As shown in FIG. 7, the integrated circuit layout 10D is substantially the same as the integrated circuit layout 10B shown in FIG. 5 except that the well boundaries 116$a$ and 216$a$ are not overlapped with the centerlines 114 and 214 of the first standard cell Cell-A and the second standard cell Cell-B. More specifically, the well boundary 116$a$ is at a side of the centerline 114 closer to the active region 120$p$ of the first standard cell Cell-A and extends along the first direction X. The well boundary 216$a$ is at a side of the centerline 214 closer to the active region 220$p$ of the second standard cell Cell-B and extends along the first direction X. In this embodiment, the distance between the boundary 116$a$ and the centerline 114 and the distance between the boundary 216$a$ and the centerline 214 may be the same. Therefore, after abutting the first standard cell Cell-A and the second standard cell Cell-B in the way that the boundaries 116$a$ and 216$a$ are aligned along the first direction X, the centerline 114 and the centerline 214 may also be aligned along the first direction X.

Figure 8:
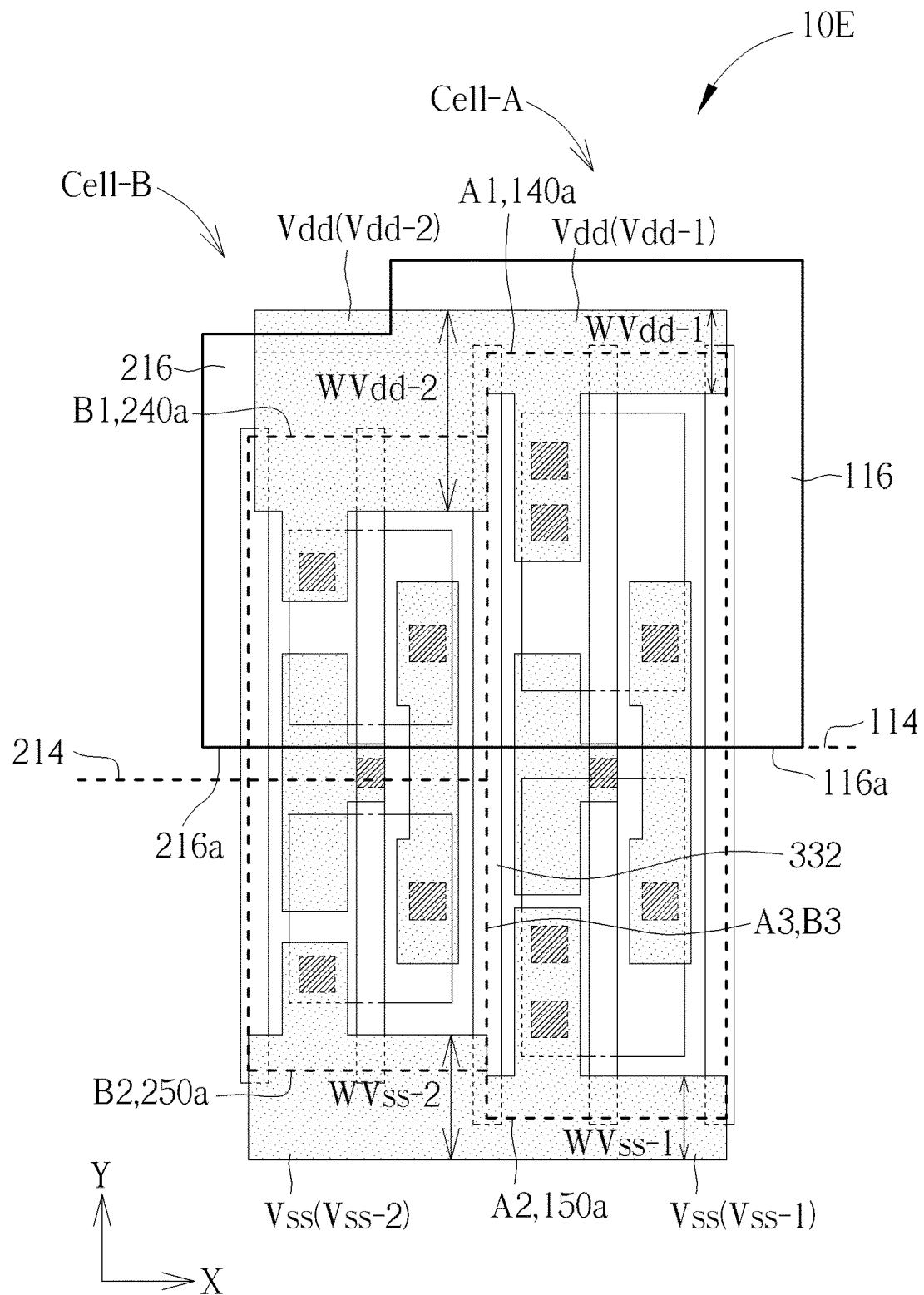
FIG. 8 is a schematic plan view of an integrated circuit layout according to an embodiment of the present invention.

Please refer to FIG. 8, which is a schematic plan view of an integrated circuit layout 10E according to an embodiment of the present invention. The integrated circuit layout 10E shown in FIG. 8 is substantially the same as the integrated circuit layout 10B shown in FIG. 5 except that the well boundary 216$a$ is not overlapped with the centerline 214 of the second standard cell Cell-B. More specifically, the well boundary 216$a$ is at a side of the centerline 214 closer to the active region 220$p$ of the second standard cell Cell-B and extends along the first direction X. The well boundary 116$a$ is overlapped with the centerline 114 of the first standard cell Cell-A. After abutting the first standard cell Cell-A and the second standard cell Cell-B in the way that the boundaries 116$a$ and 216$a$ are aligned along the first direction X, the centerline 114 and the centerline 214 are offset along the first direction X. In this embodiment, the extending width E1 (shown in FIG. 4) of the power rail 240 is larger than the extending width E2 (shown in FIG. 4) of the ground rail 250, and the width WVdd-2 of the resulting wide portion Vdd-2 of the power line Vdd may be larger than the width WVss-2 of the resulting wide portion Vss-2 of the ground line Vss.

Figure 9:
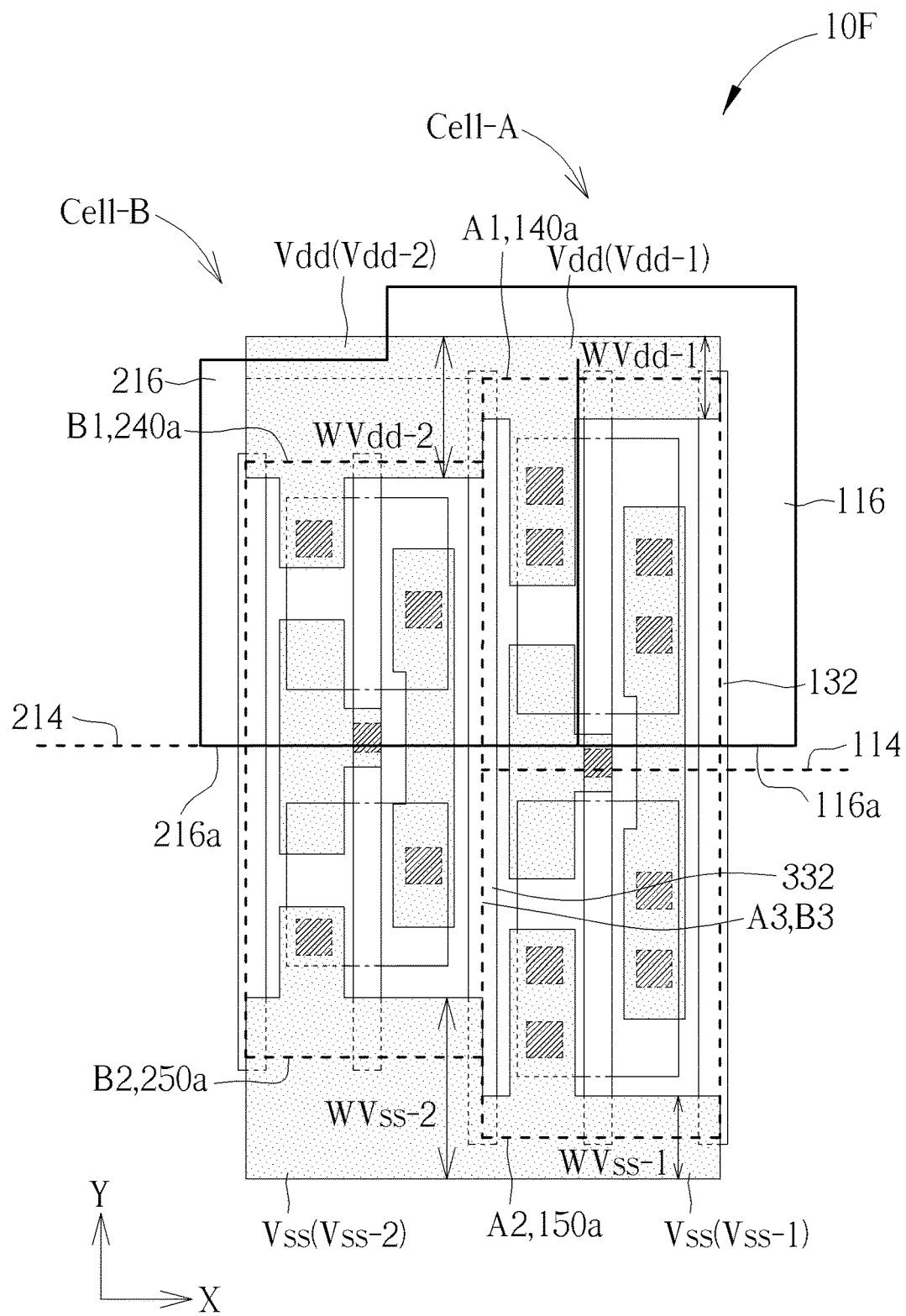
FIG. 9 is a schematic plan view of an integrated circuit layout according to an embodiment of the present invention.

Please refer to FIG. 9, which is a schematic plan view of an integrated circuit layout 10F according to an embodiment of the present invention. The integrated circuit layout 10E shown in FIG. 8 is substantially the same as the integrated circuit layout 10B shown in FIG. 5 except that the well boundary 116$a$ is not overlapped with the centerline 114 of the first standard cell Cell-A. More specifically, the well boundary 116$a$ is at a side of the centerline 114 closer to the active region 120$p$ of the first standard cell Cell-B and extends along the first direction X. The well boundary 216$a$ is overlapped with the centerline 214 of the second standard cell Cell-B. After abutting the first standard cell Cell-A and the second standard cell Cell-B in the way that the boundaries 116$a$ and 216$a$ are aligned along the first direction X, the centerline 114 and the centerline 214 are offset along the first direction X. In this embodiment, the extending width E1 (shown in FIG. 4) of the power rail 240 is smaller than the extending width E2 (shown in FIG. 4) of the ground rail 250, and the width WVdd-2 of the resulting wide portion Vdd-2 of the power line Vdd may be smaller than the width WVss-2 of the resulting wide portion Vss-2 of the ground line Vss.

Figure 11:
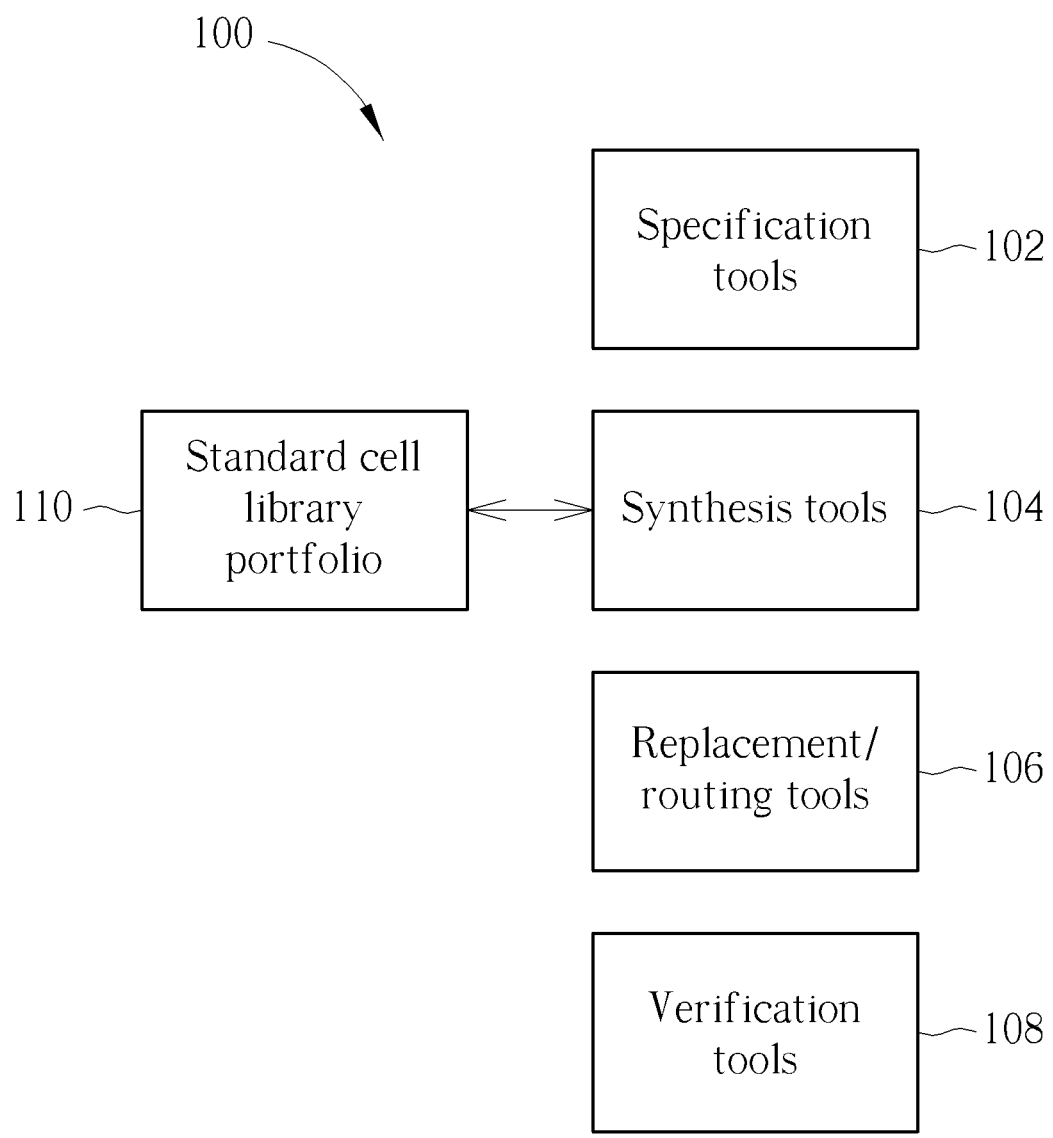
FIG. 11 depicts an electronic design automation (EDA) environment used to perform the method shown in FIG. 2.

Please refer to FIG. 11, which depicts an electronic design automation (EDA) environment used to perform the method shown in FIG. 2 according to an embodiment of the present invention. The environment 100 includes specification tools 102, synthesis tools 104, placement/routing tools 106, verification tools 108, and a standard cell library portfolio 110. During the design process, the functionality of the chip is specified in a specification tool 102 using a standard hardware programming language such as verilog. The resulting circuit description is synthesized/mapped into the basic gates of standard cells retrieved from at least a cell library from the standard cell library portfolio 110 by using one or more synthesis tools 104 such as DesignCompiler (produced by Synopsys, Inc.). The resulting gate netlist is then placed and routed using placement/routing tools 106 such as Blast-Fushion (produced by Magma, Inc.). Finally, the connectivity and functionality of the integrated circuit are verified using a verification tool 108.

In conclusion, the present invention provides a method to generate an integrated circuit layout including mixed-height standard cells. The cells are abutted on their side edges and, critically, have their well boundaries aligned along the row direction. Following, the voltage rails of the abutting standard cells are connected by extending widths and/or lengths of the voltage rails, so that continuous voltage rails running along the row boundaries to tie the standard cells are obtained. The synthesis methodology of the present invention effectively facilitates the synthesis process, and the integrated circuit layout obtained therefrom may avoid rule violations such as violations of the well enclosure/space rules. The use of these mixed-height standard cells may produce circuits having optimized area, speed and power efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit layout, comprising:
   a power rail and a ground rail extending in parallel along a first direction and respectively having a narrow portion connected to a wide portion;
   a first standard cell between the narrow portions of the power rail and the ground rail; and
   a second standard cell between the wide portions of the power rail and the ground rail and abutted to a side of the first standard cell, wherein the first standard cell and the second standard cell respectively comprise:
      an upper edge overlapping the power rail, a lower edge overlapping the ground rail, and a well boundary between the upper edge and the lower edge;
      two active regions of opposite conductivity types at two sides of the well boundary; and
      a gate line extending between the upper edge and the lower edge along a second direction and intersecting the two active regions, wherein the first direction and the second direction are perpendicular,
   wherein a first cell height between the upper edge and lower edge of the first standard cell and a second cell height between the upper edge and lower edge of the second standard cell are different, the well boundaries of the first standard cell and the second standard cell are aligned along the first direction.

2. The integrated circuit layout according to claim 1, wherein a centerline between the upper edge and the lower edge of the first standard cell and a centerline between the upper edge and the lower edge of the second standard cell are aligned along the first direction.

3. The integrated circuit layout according to claim 2, wherein the centerline and the well boundary of each of the first standard cell and the second standard cell are overlapped.

4. The layout according to claim 2, wherein the centerline and the well boundary of each of the first standard cell and the second standard cell are not overlapped.

5. The integrated circuit layout according to claim 1, wherein a distance between the narrow portion of the power rail and an edge of the active regions of the first standard cell close to the narrow portion and a distance between the wide portion of the power rail and an edge of the active regions of the second standard cell close to the wide portion are the same.

6. The integrated circuit layout according to claim 1, wherein the upper edge of the first standard cell overlaps a centerline of the narrow portion of the power rail, the lower edge of the first standard cell overlaps a centerline of the narrow portion of the ground rail.

7. The integrated circuit layout according to claim 1, wherein edges of the active regions of a same conductivity type of the first standard cell and the second standard cell adjacent to the well boundary are aligned along the first direction.

8. The integrated circuit layout according to claim 1, wherein edges of the active regions of a same conductivity type of the first standard cell and the second standard cell adjacent to the well boundary are offset along the first direction.

9. The integrated circuit layout according to claim 1, further comprising:
   a first conductive connector extending from an edge of the narrow portion of the power rail along the second direction a first length to partially overlap one of the active regions of the first standard cell; and
   a second conductive connector extending from an edge of wide portion of the power rail a second length to partially overlap one of the active regions of the second standard cell,
   wherein the first length and the second length are different.

10. The integrated circuit layout according to claim 1, further comprising:
    a first dummy gate line at a side of the first standard cell opposite to the second standard cell;
    a second dummy gate line at a side of the second standard cell opposite to the second standard cell; and
    a third dummy gate line between the first standard cell and the second standard cell, wherein the first dummy gate line and the third dummy gate line have line ends flush with line ends of the gate line of the first standard cell, the second dummy gate line has line ends flush with line ends of the gate line of the second standard cell.

* * * * *